(12) United States Patent
Fujita et al.

(10) Patent No.: US 12,295,188 B2
(45) Date of Patent: May 6, 2025

(54) INFRARED OPTICAL DEVICE

(71) Applicant: Asahi Kasei Microdevices Corporation, Tokyo (JP)

(72) Inventors: Hiromi Fujita, Tokyo (JP); Osamu Morohara, Tokyo (JP); Daiki Yasuda, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 399 days.

(21) Appl. No.: 18/050,465

(22) Filed: Oct. 28, 2022

(65) Prior Publication Data
US 2023/0134457 A1  May 4, 2023

(30) Foreign Application Priority Data

Oct. 28, 2021 (JP) ................................. 2021-176916
Aug. 30, 2022 (JP) ................................. 2022-137171

(51) Int. Cl.
| | |
|---|---|
| H01L 33/46 | (2010.01) |
| H10F 30/22 | (2025.01) |
| H10F 77/124 | (2025.01) |
| H10F 77/30 | (2025.01) |
| H10H 20/825 | (2025.01) |
| H10H 20/841 | (2025.01) |

(52) U.S. Cl.
CPC .......... *H10H 20/841* (2025.01); *H10F 30/22* (2025.01); *H10F 77/12485* (2025.01); *H10F 77/306* (2025.01); *H10H 20/825* (2025.01)

(58) Field of Classification Search
CPC ............... H10H 20/841; H10H 20/825; H10H 20/8581; H10H 29/0362; H10F 30/22; H10F 77/12485; H10F 77/306; H10F 39/1892; H10D 30/6756; A61K 40/4214; A23B 11/25
See application file for complete search history.

(56) References Cited

U.S. PATENT DOCUMENTS

| | | |
|---|---|---|
| 2007/0034852 A1 | 2/2007 | Nelson |
| 2009/0278163 A1 | 11/2009 | Sakamoto et al. |
| 2017/0345958 A1 | 11/2017 | Meyer et al. |

FOREIGN PATENT DOCUMENTS

| | | |
|---|---|---|
| JP | 2007103613 A | 4/2007 |
| JP | 2008066584 A | 3/2008 |

(Continued)

*Primary Examiner* — Ermias T Woldegeorgis
(74) *Attorney, Agent, or Firm* — KENJA IP LAW PC

(57) ABSTRACT

Provided is a high-performance infrared optical device including a reflecting layer structure that can be widely used in the mid-infrared region. An infrared optical device that has a light emission/reception property of having a peak at a center wavelength λ comprises: a semiconductor substrate; and a thin film laminate portion including a first reflecting layer formed on the semiconductor substrate, a lower semiconductor layer of a first conductivity type, a light emitting/receiving layer, an upper semiconductor layer of a second conductivity type, and a second reflecting layer in the stated order, wherein the first reflecting layer has a constituent material made of AlGaInAsSb where 0≤Al+Ga≤0.5 and 0≤As≤1.0, and includes a plurality of layers that differ in impurity concentration, and the center wavelength λ is 2.5 μm or more at room temperature.

18 Claims, 11 Drawing Sheets

(56) References Cited

FOREIGN PATENT DOCUMENTS

| | | | |
|---|---|---|---|
| JP | 2009505420 A | 2/2009 | |
| JP | 2014179427 A | 9/2014 | |
| WO | WO-2019187809 A1 * | 10/2019 | .......... H01S 5/18311 |

* cited by examiner

INFRARED OPTICAL DEVICE

CROSS REFERENCE TO RELATED APPLICATION

This application claims priority of Japanese Patent Application Nos. 2021-176916 (filed on Oct. 28, 2021) and 2022-137171 (filed on Aug. 30, 2022), the entire disclosures of which are incorporated herein by reference.

TECHNICAL FIELD

The present disclosure relates to an infrared optical device.

BACKGROUND

Infrared rays in the short-wavelength, mid-wavelength, and long-wavelength infrared region (referred to as "mid-infrared region") of about 2 μm to 15 μm in wavelength are used particularly in non-dispersive infrared absorption-type gas concentration measurement instruments because gas molecules have unique absorption bands for such infrared rays. In particular, infrared optical devices are important members that significantly influence the main performance of gas concentration measurement instruments such as detection resolution and power consumption, and there is a need for infrared optical devices having high light emission intensity or light reception sensitivity at desired wavelengths. The term "optical device" herein means a light emitting element or a light receiving element. For example, a light emitting diode (LED) is used as a light emitting element, and a photodiode (PD) is used as a light receiving element. Such infrared optical devices using semiconductors are capable of light emission/reception in desired wavelength bands by material design, and are used in gas concentration measurement instruments.

Known methods of enhancing the performance of such infrared optical devices use resonant structures. For example, a method that, in the near-infrared region, sandwiches a light emitting region by reflecting mirrors using GaAs/AlGaAs from above and below to improve the luminous efficiency at specific wavelengths by the resonance effect is known (PTL 1). The reflecting mirrors are also called distributed Bragg reflectors (DBRs), and are formed by laminating a high-refractive-index thin film and a low-refractive-index thin film having a film thickness of approximately ¼ of a desired wavelength to exhibit high reflectance at the desired wavelength. Regarding the mid-infrared region, for example, a method using InAs/GaSb as mirror material is disclosed (PTL 2). A method of enhancing the sensitivity of light receiving elements such as photodiodes by using the same resonance effect is also known.

CITATION LIST

Patent Literature

PTL 1: JP 2007-103613 A
PTL 2: JP 2009-505420 A

SUMMARY

However, in an infrared optical device composed of semiconductor thin films, various materials having different bandgaps, such as AlInAs, AlInSb, and InAsSb, need to be combined for semiconductor layers including mirrors and light emitting/receiving layers. Since these material systems typically differ from each other in lattice constant, dislocations occur from an interface of the laminate, as a result of which the light emission/reception property degrades. Hence, materials that differ from each other but have similar lattice constants, such as the foregoing GaAs/AlGaAs or InAs/GaSb, are used as mirror materials. This limits the applicable materials and wavelength bands.

It could therefore be helpful to provide a high-performance infrared optical device including a reflecting layer structure that can be widely used in the mid-infrared region.

(1) An infrared optical device according to an embodiment of the present disclosure is an infrared optical device that has a light emission/reception property of having a peak at a center wavelength $\lambda$, the infrared optical device comprising: a semiconductor substrate; and a thin film laminate portion including a first reflecting layer formed on the semiconductor substrate, a lower semiconductor layer of a first conductivity type, a light emitting/receiving layer, an upper semiconductor layer of a second conductivity type, and a second reflecting layer in the stated order, wherein the first reflecting layer has a constituent material made of AlGaInAsSb where $0 \leq Al+Ga \leq 0.5$ and $0 \leq As \leq 1.0$, and includes a plurality of layers that differ in impurity concentration, and the center wavelength $\lambda$ is 2.5 μm or more at room temperature.

(2) As an embodiment of the present disclosure, in (1), the first reflecting layer includes: a low-refractive-index layer that is composed of an n-type semiconductor layer of $1.0 \times 10^{18}/cm^3$ or more; and a high-refractive-index layer that is composed of at least one out of a p-type semiconductor layer, an intrinsic semiconductor layer, and an n-type semiconductor layer lower in impurity concentration than the n-type semiconductor layer of the low-refractive-index layer and has a higher refractive index than the low-refractive-index layer, and the first reflecting layer is a laminate of a plurality of layers obtained by alternately laminating the low-refractive-index layer and the high-refractive-index layer.

(3) As an embodiment of the present disclosure, in (2), the low-refractive-index layer includes an n-type semiconductor layer of $3.0 \times 10^{18}/cm^3$ or more.

(4) As an embodiment of the present disclosure, in (2) or (3), the high-refractive-index layer includes at least one out of the p-type semiconductor layer, the intrinsic semiconductor layer, and an n-type semiconductor layer of less than $8.0 \times 10^{17}/cm^3$.

(5) As an embodiment of the present disclosure, in any of (1) to (4), a material of the light emitting/receiving layer contains AlGaInAsSb where $0 \leq Al+Ga \leq 0.5$ and $0 \leq As \leq 1.0$, and the center wavelength $\lambda$ is 3.0 μm or more at the room temperature.

(6) As an embodiment of the present disclosure, in any of (1) to (5), the first reflecting layer is a laminate of 2 layers or more and 30 layers or less, and the center wavelength $\lambda$ is 4.0 μm or more at the room temperature.

(7) As an embodiment of the present disclosure, in any of (1) to (6), the first reflecting layer is a laminate of 2 layers or more and 12 layers or less, and the center wavelength $\lambda$ is 6.0 μm or more at the room temperature.

(8) As an embodiment of the present disclosure, in any of (1) to (7), the first reflecting layer is a laminate of 2 layers or more and 6 layers or less, and the center wavelength $\lambda$ is 8.0 μm or more at the room temperature.

(9) As an embodiment of the present disclosure, in any of (1) to (8), the light emitting/receiving layer includes a double heterostructure or one or more quantum well structures.

(10) As an embodiment of the present disclosure, in any of (1) to (9), the light emitting/receiving layer includes a plurality of light emitting/receiving regions connected by a tunnel junction.

(11) As an embodiment of the present disclosure, in any of (1) to (10), the infrared optical device further comprises a lower electrode layer, and the lower electrode layer contacts the lower semiconductor layer.

(12) As an embodiment of the present disclosure, in any of (1) to (11), the thin film laminate portion further includes a third reflecting layer made of a material different from the first reflecting layer, between the semiconductor substrate and the first reflecting layer.

(13) As an embodiment of the present disclosure, in (12), the semiconductor substrate is a GaAs substrate, and a constituent material of the third reflecting layer is made of AlGaAs where $0 \leq Al \leq 1.0$.

(14) As an embodiment of the present disclosure, in any of (1) to (13), the semiconductor substrate is semi-insulating, and the thin film laminate portion comprises a plurality of thin film laminate portions formed on the semiconductor substrate and connected in series or in parallel.

(15) As an embodiment of the present disclosure, in any of (1) to (14), the second reflecting layer is composed of an electrode.

(16) As an embodiment of the present disclosure, in any of (1) to (14), the infrared optical device further includes an upper electrode layer, and the upper electrode layer contacts the upper semiconductor layer.

(17) As an embodiment of the present disclosure, in any of (1) to (16), light enters or exits from a side on which the semiconductor substrate is located.

(18) As an embodiment of the present disclosure, in any of (1) to (17), the first reflecting layer has a constituent material made of AlGaInAsSb where $0 \leq Al+Ga \leq 0.5$ and $0 \leq As \leq 0.5$, and includes a plurality of layers that differ in impurity concentration.

It is thus possible to provide a high-performance infrared optical device including a reflecting layer structure that can be widely used in the mid-infrared region. According to an aspect of the present disclosure, it is possible to provide an infrared optical device having high light emission property or light reception property in the mid-infrared wavelength region.

DETAILED DESCRIPTION

Figure 1:
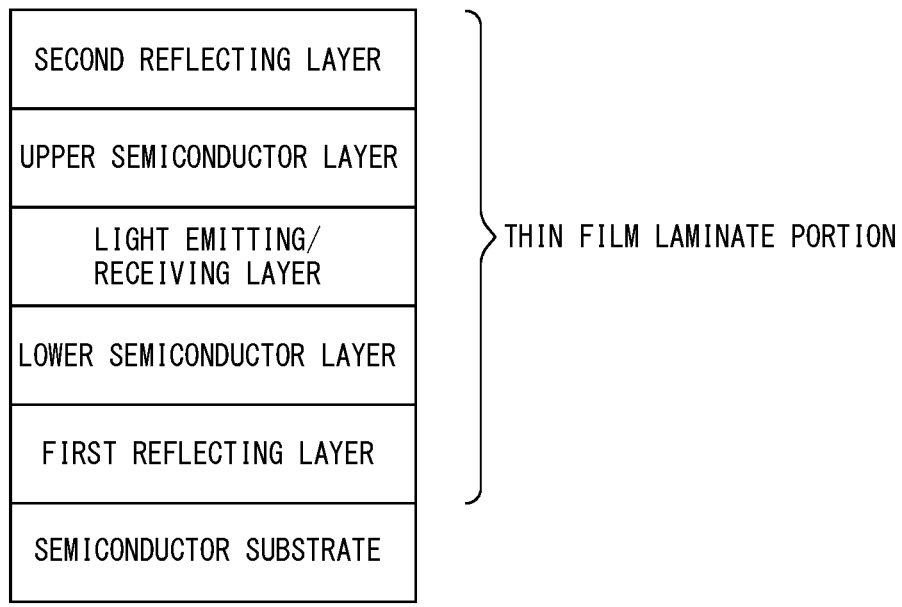
FIG. 1 is a configuration diagram of an infrared optical device according to an embodiment.

Embodiments of the present disclosure will be described below, with reference to the drawings. The drawings are schematic, and the thicknesses, lengths, etc. are not the actual thicknesses, lengths, etc. Various modifications can be made to the technical idea of the present disclosure within the technical scope defined by the claims. The embodiments described below do not limit the subject matter defined in the claims. Not all combinations of features described in the embodiments are essential for solving the stated problems.

<Infrared Optical Device>

An infrared optical device according to an embodiment has a light emission/reception property of having at least one peak at a center wavelength λ. The infrared optical device includes a semiconductor substrate and a thin film laminate portion.

The number of peaks may be one or more. The number and shapes of peaks can vary depending on the reflection and transmission properties of a first reflecting layer and a second reflecting layer and the length of the below-described resonator.

The "infrared optical device" herein is an infrared light emitting element or an infrared light receiving element, and is a collective name for these layers. An infrared light emitting element is implemented by the structure of the infrared optical device described below, and an infrared light receiving element is implemented by the same structure. An infrared light emitting element is manufactured by the below-described infrared optical device manufacturing method, and an infrared light receiving element is manufactured by the same manufacturing method. In the case where the infrared optical device is an infrared light emitting element, the infrared optical device may be a light emitting diode. The infrared optical device may be a vertical resonator type surface emitting laser that emits light in a direction perpendicular to the thin film surface. For example, in a Fabry-Perot laser that emits light in a direction horizontal to the thin film surface, too, the infrared optical device may be used for light confinement in a direction perpendicular to the thin film surface. In the case where the infrared optical device is an infrared light receiving element, the infrared optical device may be a photodiode. The infrared optical device may be an nBn detector or a pBp detector, as described later. Since the infrared optical device exhibits specifically high performance at the center wavelength λ, the infrared optical device can be used for energy transmission, waste heat power generation using thermophotovoltaic, and the like.

<Semiconductor Substrate>

The infrared optical device according to this embodiment includes the semiconductor substrate. For example, a Si substrate, an InP substrate, a GaAs substrate, or the like may be used. An InAs substrate, a GaSb substrate, an InSb substrate, or the like is preferred as a substrate for forming a low-defect and high-performance light emitting/receiving layer element because its lattice constant is close to that of the material of the light emitting/receiving layer described later.

Particularly in the mid-wavelength to long-wavelength infrared region, free electron absorption by electrons or holes is noticeable, and accordingly a semiconductor substrate with a low impurity concentration (carrier concentration) is preferred. Further, the use of a semi-insulating GaAs substrate can suppress such free electron absorption, and electrically insulate and separate the thin film laminate portion formed on the substrate. Hence, by connecting a plurality of thin film laminate portions in series or in parallel using electrode wiring, it is possible to obtain an infrared optical device having desired electrical and optical properties.

<Thin Film Laminate Portion>

The infrared optical device according to this embodiment includes the thin film laminate portion formed on the semiconductor substrate. The thin film laminate portion includes at least the first reflecting layer, a lower semiconductor layer of a first conductivity type, a light emitting/receiving layer, an upper semiconductor layer of a second conductivity type, and the second reflecting layer in this order from the semiconductor substrate side. The thin film laminate portion may further include a third reflecting layer between the semiconductor substrate and the first reflecting layer.

<First Reflecting Layer>

The first reflecting layer has a constituent material containing a combination of at least one of Al, Ga, and In out of group 13 elements and at least one of As and Sb out of group 15 elements, and is composed of a laminate of a plurality of layers that differ in impurity concentration. By narrowing the Al and Ga composition range in the constituent material, better crystal growth is enabled and the performance of the infrared optical device is improved. Accordingly, AlGaInAsSb ($0 \leq Al+Ga \leq 0.5$, $0 \leq As \leq 1.0$) is preferable.

Herein, the description in the parentheses indicates the composition ratio in the mixed crystal. "($0 \leq Al+Ga \leq 0.5$, $0 \leq As \leq 1.0$)" indicates that, in $Al_xGa_yIn_{1-x-y}As_zSb_{1-z}$, the sum x+y of the composition ratios of Al and Ga is 0 or more and 0.5 or less and the composition ratio z of As is 0 or more and 1.0 or less. Composition ratios are hereafter expressed in the same manner. We newly discovered that, in the mid-infrared region, the refractive index can be widely controlled by impurity-doping the foregoing material and controlling the impurity concentration (carrier concentration). The carrier concentration herein is determined by the impurity concentration and the activation rate.

As a result of forming a laminate of a plurality of layers that differ in impurity concentration (i.e. impurity doping concentration), a laminate structure that differs in refractive index is formed. The plurality of different layers may be each made of a different material, or made of the same material with only the impurity doping concentration being different. By appropriately designing the film thicknesses according to the desired wavelength, a DBR having a low-refractive-index layer and a high-refractive-index layer laminated therein can be formed. The refractive index of the high-refractive-index layer is higher than the refractive index of the low-refractive-index layer. Favorable reflection property can be achieved by setting, for example, the film thickness of each layer to λ/4n where n is the refractive index in the layer.

The first reflecting layer and the below-described second reflecting layer function as mirrors for mid-infrared light, and the lower semiconductor layer, the light emitting/receiving layer, and the upper semiconductor layer located between the first and second reflecting layers in the lamination direction function as a resonator. With such a structure, an infrared optical device having a light emission/reception property of having a peak at the desired center wavelength λ can be formed. The lower semiconductor layer or the upper semiconductor layer may contribute to reflection. In this case, a layer not contributing to reflection functions as a resonator. The number of peaks is not limited to one, and may be two or more.

In particular, by using an n-type semiconductor layer having an impurity concentration of $1.0 \times 10^{18}/cm^3$ or more as the low-refractive-index layer, a low-refractive-index thin film can be formed. By using, as the high-refractive-index layer, at least one of a p-type semiconductor layer, an intrinsic semiconductor layer, and an n-type semiconductor layer whose impurity concentration is lower than that of the n-type semiconductor layer of the low-refractive-index layer, a high-refractive-index thin film can be formed. An example of the p-type semiconductor layer is a semiconductor layer having an impurity concentration from $10^{16}/cm^3$ to $10^{19}/cm^3$. The use of a laminate of a plurality of layers obtained by alternately laminating the low-refractive-index layer and the high-refractive-index layer makes it possible to form a suitable first reflecting layer.

As the low-refractive-index layer, an n-type semiconductor layer having an impurity concentration of $1.5 \times 10^{18}/cm^3$ or more may be used. The low-refractive-index layer is more preferably an n-type semiconductor layer of $3.0 \times 10^{18}/cm^3$ or more. If the impurity concentration of the n-type semiconductor layer is $4.0 \times 10^{18}/cm^3$ or more, the refractive index can be further decreased. The high-refractive-index layer made of an n-type semiconductor needs to be lower in impurity concentration than the low-refractive-index layer. The high-refractive-index layer is more preferably an n-type semiconductor layer of $1.5 \times 10^{18}/cm^3$ or less. If the impurity concentration of the high-refractive-index layer is $8.0 \times 10^{17}/cm^3$ or less, the refractive index can be further increased. As the high-refractive-index layer made of an n-type semiconductor, a high-refractive-index layer having an impurity concentration of $1.0 \times 10^{17}/cm^3$ or less is often used. When the difference in impurity concentration between the low-refractive-index layer and the high-refractive-index layer is greater, the performance of the first reflecting layer is better. In the first reflecting layer formed by laminating the plurality of layers, the compositions and impurity concentrations of the low-refractive-index layer and the high-refractive-index layer may be different between the layers.

As impurities, for example, Sn and Te are used as n-type doping materials, and Zn, Be, and Ge are used as p-type doping materials. Moreover, Si is used as an n-type doping material or a p-type doping material depending on the base semiconductor. The impurity materials are, however, not limited to such. The impurity concentrations can be evaluated, for example, by secondary ion mass spectrometry (SIMS).

As a result of the number of layers in the first reflecting layer being 2 or more, a resonator can be formed in the region interposed between the first reflecting layer and the second reflecting layer. As the number of layers increases, the reflectance is improved. The number of layers in the first reflecting layer is preferably 3 or more, because higher reflectance can be achieved. In the case where the center wavelength λ is 6.0 μm or more, the absorption loss in the first reflecting layer is noticeable due to free carrier absorption in the doped semiconductor. Hence, an upper limit is placed on the optimal number of layers of the first reflecting layer. For example, in the case where the center wavelength λ is 6.0 μm or more, the number of layers in the first reflecting layer is preferably 12 or less. In the case where the center wavelength λ is 8.0 μm, the number of layers in the first reflecting layer is preferably 6 or less. In the case where the absorption loss is noticeable, the number of layers is often set to 5 or less, or 4 or less. Even in the case where the center wavelength λ is 6.0 μm or less, an upper limit is placed on the number of layers under the constraints in the element fabrication process, and the number of layers in the first reflecting layer is 30 or less. As an example, in the case where the center wavelength λ is 3.0 μm or 4.0 μm or more and 6.0 μm or less at room temperature, the first reflecting layer is composed of a laminate of 2 layers or more and 30 layers or less.

Given that narrowing the As composition range in the AlGaInAsSb mixed crystal material enables better crystal growth and improves the performance of the infrared optical device, AlGaInAsSb (0≤Al+Ga≤0.5, 0≤As≤0.5) may be used. The As composition range may be further narrowed to use AlGaInAsSb (0≤Al+Ga≤0.5, 0≤As≤0.3). Given that narrowing the Al and Ga composition range enables better crystal growth and improves the performance of the infrared optical device, AlGaInAsSb (0≤Al+Ga≤0.3, 0≤As≤0.3) may be used. Further, AlGaInAsSb (0≤Al+Ga≤0.2, 0≤As≤0.2) may be used. A quaternary mixed crystal with a Ga composition of 0 may be used to obtain a simple structure that is easier to control.

Likewise, given that narrowing the As composition range in the AlGaInAsSb mixed crystal material enables better crystal growth and improves the performance of the infrared optical device, AlGaInAsSb (0≤Al+Ga≤0.5, 0.7≤As≤1.0) may be used. Given that narrowing the Al and Ga composition range enables better crystal growth and improves the performance of the infrared optical device, AlGaInAsSb (0≤Al+Ga≤0.3, 0.7≤As≤1.0) may be used. Further, AlGaInAsSb (0≤Al+Ga≤0.2, 0.8≤As≤1.0) may be used. A quaternary mixed crystal with a Ga composition of 0 may be used to obtain a simple structure that is easier to control.

For purposes such as reducing thin film dislocations, a thin film layer having a greatly different lattice constant may be included. For example, a semiconductor layer (thin film layer) of a composition outside the foregoing Al and Ga composition range and As composition range may be included if the thickness of the layer is less than or equal to 1/10 of the value obtained by dividing the center wavelength λ by the refractive index n of the layer. In such a case, the thin film layer having a greatly different lattice constant is not treated as the first reflecting layer, and is not counted in the number of layers in the first reflecting layer.

Particularly in the case where the constituent material of the below-described light emitting/receiving layer mainly contains InAsSb (0≤As≤0.2), it is preferable to use AlGaInSb (0≤Al+Ga≤0.2) as the material of the first reflecting layer and use AlGaInSb (0≤Al+Ga≤0.5) as the material of the thin film layer included for purposes such as dislocation reduction. A ternary mixed crystal with a Ga composition of 0 may be used to obtain a simple structure that is easier to control.

Likewise, particularly in the case where the constituent material of the below-described light emitting/receiving layer mainly contains InAsSb (0.8≤As≤1.0), it is preferable to use AlGaInAs (0≤Al+Ga≤0.2) as the material of the first reflecting layer and use AlGaInAs (0≤Al+Ga≤0.5) as the material of the thin film layer included for purposes such as dislocation reduction. A ternary mixed crystal with a Ga composition of 0 may be used to obtain a simple structure that is easier to control.

Current may flow through the first reflecting layer to function as an infrared optical device. In this case, the series resistance of the first reflecting layer poses a problem. However, the series resistance can be reduced, for example, by connecting a plurality of n-type semiconductor layers different in impurity concentration or connecting an n-type semiconductor layer and a p-type semiconductor layer via a tunnel junction.

By making at least part of the first reflecting layer high resistance and performing element isolation by the high resistance layer, a plurality of infrared optical devices may be connected in series. In this case, for example, undoped AlInSb (0.05≤Al≤0.2) may be used as the high-resistance layer.

<Light Emitting/Receiving Layer>

The light emitting/receiving layer is a light emitting layer or a light receiving layer. The term is a collective name for these layers. The light emitting/receiving layer forms a resonator interposed between the first reflecting layer and the second reflecting layer, and emits or receives light having the center wavelength λ. As the light emitting/receiving layer, for example, a thin film containing AlGaInAsSb (0≤Al+Ga≤0.5, 0≤As≤1.0) may be used. The light emitting/receiving layer may be a thin film of a single composition consisting of the material, or may be formed by laminating different materials. The light emitting/receiving layer may be a laminate including a double heterostructure using a semiconductor layer having a plurality of bandgaps or one or more quantum well structures. The use of the double heterostructure or the quantum well structure in the light emitting element can reduce the film thickness of the light emitting region and reduce the loss due to self-absorption of emitted light. The use of the double heterostructure or the quantum well structure in the light receiving element can reduce the film thickness of the light receiving region and improve the resistance. To facilitate injection or extraction of carriers into or from the foregoing double heterostructure or quantum well structure, the regions sandwiching the structure may be slight-doped. The term "slight doping" herein refers to impurity doping with an impurity concentration lower than that of an n-type semiconductor layer and a p-type semiconductor layer. As an example, "slight doping" means to form a layer having an impurity concentration of about $1.0 \times 10^{17}/cm^3$. The light emitting/receiving layer may include a plurality of light emitting/receiving regions connected by a tunnel junction.

As the constituent material of the light emitting/receiving layer, AlGaInAsSb (0≤Al+Ga≤0.5, 0≤As≤0.3) may be used given that narrowing the As composition range of the AlGaInAsSb mixed crystal material enables better crystal growth. Given that narrowing the Al and Ga composition range enables better crystal growth, AlGaInAsSb (0≤Al+

Ga≤0.3, 0≤As≤0.3) may be used. Further, AlGaInAsSb (0≤Al+Ga≤0.2, 0≤As≤0.2) may be used. For example, by fixing the In composition and changing the ratio of Al and Ga, it is possible to control the bandgap of the material, i.e. the light emitting edge wavelength or the light receiving edge wavelength, without significantly changing the lattice constant. A quaternary mixed crystal with a Ga composition of 0 may be used to obtain a simple structure that is easier to control.

Likewise, as the constituent material of the light emitting/receiving layer, AlGaInAsSb (0≤Al+Ga≤0.5, 0.7≤As≤1.0) may be used given that narrowing the As composition range of the AlGaInAsSb mixed crystal material enables better crystal growth. Given that narrowing the Al and Ga composition range enables better crystal growth, AlGaInAsSb (0≤Al+Ga≤0.3, 0.7≤As≤1.0) may be used. Further, AlGaInAsSb (0≤Al+Ga≤0.2, 0.8≤As≤1.0) may be used. For example, by fixing the In composition and changing the ratio of Al and Ga, it is possible to control the bandgap of the material, i.e. the light emitting edge wavelength or the light receiving edge wavelength, without significantly changing the lattice constant. A quaternary mixed crystal with a Ga composition of 0 may be used to obtain a simple structure that is easier to control.

For example, AlInSb may be used as the material of the light emitting/receiving layer particularly suitable for the short-wavelength to mid-wavelength infrared region. By changing the Al composition in a range of 0% to 20%, it is possible to control the light emitting edge wavelength or the light receiving edge wavelength in a range of 2.3 μm to 7.3 μm at room temperature. Here, the room temperature is 25° C. The light emitting edge wavelength or the light receiving edge wavelength is a wavelength determined by the bandgap and structure of the material of the light emitting/receiving layer, and denotes the maximum wavelength at which light can be emitted or the maximum wavelength at which light can be received. As an example, in the case where the light emitting/receiving layer is an InSb thin film, a wavelength of 7.3 μm corresponding to a bandgap of 0.17 eV is the light emitting edge wavelength or the light receiving edge wavelength.

An example of the material of the light emitting/receiving layer particularly suitable for the short-wavelength to mid-wavelength infrared region is InAsSb. By changing the As composition in a range of 80% to 100%, it is possible to control the light emitting edge wavelength or the light receiving edge wavelength in a range of 3.5 μm to 5.9 μm at room temperature.

An example of the material of the light emitting/receiving layer particularly suitable for the long-wavelength infrared region is InAsSb. By changing the As composition in a range of 0% to 20%, it is possible to control the light emitting edge wavelength or the light receiving edge wavelength in a range of 7.3 μm to 12 μm at room temperature.

The light emitting/receiving layer may be an intrinsic semiconductor, or may be n-type or p-type doped. Especially in the case where the bandgap is narrow, the light emitting/receiving layer is p-type slight-doped. An example of slight doping is impurity doping from $10^{16}/cm^3$ to $10^{18}/cm^3$ in the light emitting/receiving layer made of InAsSb. There is a possibility that the lower semiconductor layer, the upper semiconductor layer, or the like other than the light emitting/receiving layer emits or receives light. To suppress light emission/reception by such a semiconductor layer other than the light emitting/receiving layer, the center wavelength λ is desirably longer than the band edge wavelength calculated from the bandgap of the semiconductor layer other than the light emitting/receiving layer.

<Lower Semiconductor Layer and Upper Semiconductor Layer>

The lower semiconductor layer is of the first conductivity type. The upper semiconductor layer is of the second conductivity type. Specific combinations of the first conductivity type and the second conductivity type will be described later. The lower semiconductor layer and the upper semiconductor layer contain, for example, AlGaInAsSb (0≤Al+Ga≤0.5, 0≤As≤1.0) as a constituent material. These layer may contribute to reflection. In the case where the uppermost layer (the layer farthest from the semiconductor substrate) in the first reflecting layer is a semiconductor layer of the first conductivity type, the uppermost layer may be used as the lower semiconductor layer. In the case where the lowermost layer (the layer closest to the semiconductor substrate) in the second reflecting layer is a semiconductor layer of the second conductivity type, the lowermost layer may be used as the upper semiconductor layer.

<Second Reflecting Layer>

The second reflecting layer is formed above the upper semiconductor layer. The constituent material of the second reflecting layer may be any of various materials such as the constituent material of the first reflecting layer and dielectrics and semiconductors including GaAs/AlGaAs and SiO2/Ge. The second reflecting layer may be a laminate of a plurality of thin films, or may be an electrode. As the material of the electrode, any of various materials may be used, as with the below-described upper electrode layer and lower electrode layer. Current may be injected into or extracted from the second reflecting layer to function as an infrared optical device, as with the upper electrode layer.

<Third Reflecting Layer>

The third reflecting layer is located between the semiconductor substrate and the first reflecting layer, and is made of a material different from the first reflecting layer. The third reflecting layer functions as a reflecting mirror together with the first reflecting layer in the present disclosure.

For example, in the case where the semiconductor substrate is an InAs substrate or a GaSb substrate, a laminate of InAs/GaSb may be used. In the case where the semiconductor substrate is a GaAs substrate, a laminate of a plurality of AlGaAs (0≤Al≤1.0) thin films that differ in Al composition is preferably used because the third reflecting layer with few crystal defects can be formed. In this case, for example, making each layer undoped leads to high resistance. By performing element isolation above or inside the third reflecting layer, an infrared optical device composed of the thin film laminate portion formed above the third reflecting layer can be connected in series. In the case where the third reflecting layer has conductivity, by performing element isolation up to the semiconductor substrate that is an insulating semiconductor substrate, a series-connected infrared optical device can be formed.

<Upper Electrode Layer and Lower Electrode Layer>

The material of each of the upper electrode layer and the lower electrode layer is preferably a material having high reflectance in the mid-infrared region, such as Au or Al. Each of the upper electrode layer and the lower electrode layer may be a laminate of different electrode materials, in order to reduce the contact resistance, improve the adhesion, and prevent mutual diffusion of the electrode material and the semiconductor material. For example, Ti, Pt, Ni, Cr, etc. may be used. The film thickness of each layer is designed so as not to hinder the reflectance in the upper electrode layer. The material of the electrode is not limited to such. The upper electrode layer and the lower electrode layer may be separate materials or the same material. The upper electrode layer and the lower electrode layer may be formed simultaneously in one process.

The upper electrode layer is provided to inject or extract current from the upper semiconductor layer side. Contact may be made to the upper semiconductor layer or to the second reflecting layer. Particularly in the case where the second reflecting layer is an insulating dielectric, contact is made to the upper semiconductor layer. Herein, "contact" means electrical connection between an electrode layer and a semiconductor layer. The lower electrode layer is provided to inject or extract current from the lower semiconductor layer side. Contact may be made to the lower semiconductor layer or to the first reflecting layer. As a result of contact being made to the lower semiconductor layer, the influence of series resistance caused by current flowing through the first reflecting layer and the like can be reduced.

<First Conductivity Type and Second Conductivity Type>

The first conductivity type and the second conductivity type may respectively be, for example, p type and n-type, or n type and p type. Thus, a light emitting diode or a photodiode can be formed. Alternatively, the first conductivity type and the second conductivity type may respectively be n type and n type, or p type and p type. As a result of a barrier layer (B) being further included, an nBn detector or a pBp detector can be formed.

Embodiment 1

FIG. 1 is a configuration diagram for explaining an infrared optical device according to Embodiment 1 of the present disclosure. As illustrated in FIG. 1, the infrared optical device according to Embodiment 1 includes: a semiconductor substrate; and a thin film laminate portion formed on the semiconductor substrate. The thin film laminate portion includes a first reflecting layer, a lower semiconductor layer, a light emitting/receiving layer, an upper semiconductor layer, and a second reflecting layer from the semiconductor substrate side.

Embodiment 2

Figure 2:
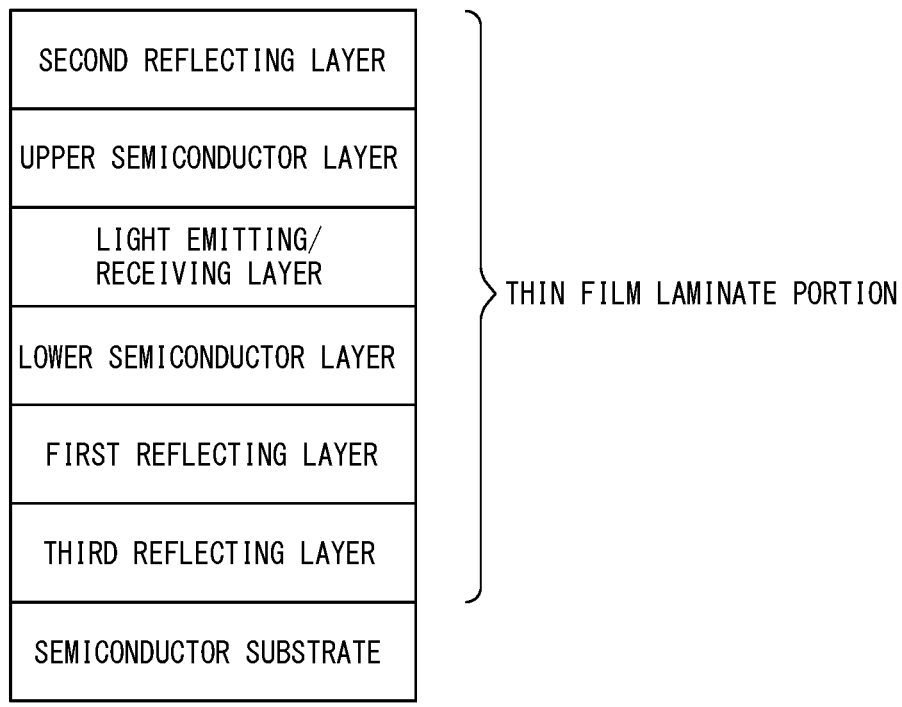
FIG. 2 is a configuration diagram of an infrared optical device according to an embodiment.

FIG. 2 is a configuration diagram for explaining an infrared optical device according to Embodiment 2 of the present disclosure. As illustrated in FIG. 2, the infrared optical device according to Embodiment 2 includes: a semiconductor substrate made of GaAs; and a thin film laminate portion formed on the semiconductor substrate and including a third reflecting layer made of AlGaAs (0≤Al≤1.0), a first reflecting layer, a lower semiconductor layer, a light emitting/receiving layer, an upper semiconductor layer, and a second reflecting layer.

Embodiment 3

Figure 3:
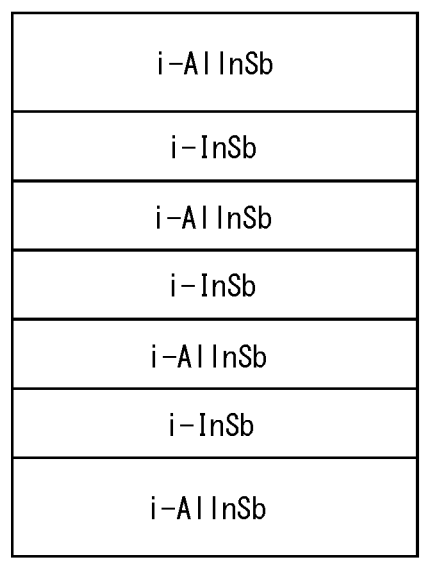
FIG. 3 is a configuration diagram of a light emitting/receiving layer in an infrared optical device according to an embodiment.

FIG. 3 is a configuration diagram for explaining a light emitting/receiving layer in an infrared optical device according to Embodiment 3 of the present disclosure. As illustrated in FIG. 3, in the infrared optical device according to Embodiment 3, the light emitting/receiving layer includes a quantum well layer formed by laminating an i-AlInSb layer and an i-InSb layer. The quantum well layer may be a single quantum well layer, or a multiple quantum well layer composed of a plurality of layers. The structure of the layers other than the light emitting/receiving layer in the infrared optical device according to this embodiment may be the same as that in Embodiment 1 or 2.

Embodiment 4

Figure 4:
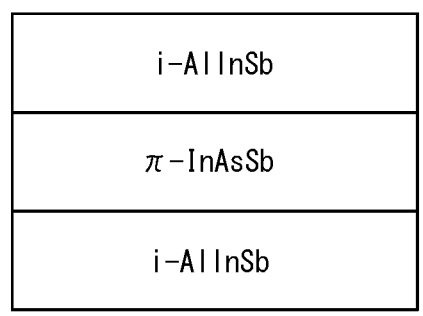
FIG. 4 is a configuration diagram of a light emitting/receiving layer in an infrared optical device according to an embodiment.

FIG. 4 is a configuration diagram for explaining a light emitting/receiving layer in an infrared optical device according to Embodiment 4 of the present disclosure. As illustrated in FIG. 4, in the infrared optical device according to Embodiment 4, the light emitting/receiving layer has a double heterostructure of an i-AlInSb layer and a π-InAsSb layer. In the light emitting element, carriers injected from the upper semiconductor layer and the lower semiconductor layer are injected into the π-InAsSb layer through the i-AlInSb layer and emit light by radiative recombination. In the light receiving element, carriers generated by light absorption in the π-InAsSb layer are extracted from the upper semiconductor layer and the lower semiconductor layer through i-AlInSb by thermionic emission.

Herein, the "π-InAsSb layer" denotes a p-type slight-doped InAsSb layer. To facilitate extraction of carriers from the π-InAsSb layer that contributes to light absorption, the i-AlInSb layers between which the π-InAsSb layer is interposed may be also slight-doped, as mentioned above. The structure of the layers other than the light emitting/receiving layer in the infrared optical device according to this embodiment may be the same as that in Embodiment 1 or 2.

Embodiment 5

Figure 5:
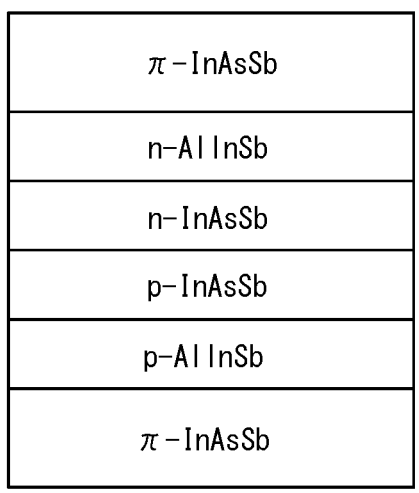
FIG. 5 is a configuration diagram of a light emitting/receiving layer in an infrared optical device according to an embodiment.

FIG. 5 is a configuration diagram for explaining a light emitting/receiving layer in an infrared optical device according to Embodiment 5 of the present disclosure. As illustrated in FIG. 5, in the infrared optical device according to Embodiment 5, the light emitting/receiving layer has a structure in which two π-InAsSb layers are connected by a tunnel junction composed of p-AlInSb/p-InAsSb/n-InAsSb/n-AlInSb layers. Each AlInSb layer functions as a barrier layer against electrons and holes. As a result of two light emitting/receiving layers being connected in series, in the light emitting element, radiative recombination is performed in the two layers with respect to certain injection current, so that the light emission intensity can be improved. In the light receiving element, the diode resistance increases. The structure is therefore particularly preferable in terms of connection with an external signal processing circuit. The number of light emitting/receiving layers is not limited to 2, and a plurality of light emitting/receiving layers may be connected by a plurality of tunnel junctions. The structure of the layers other than the light emitting/receiving layer in the infrared optical device according to this embodiment may be the same as that in Embodiment 1 or 2.

Embodiment 6

Figure 6:
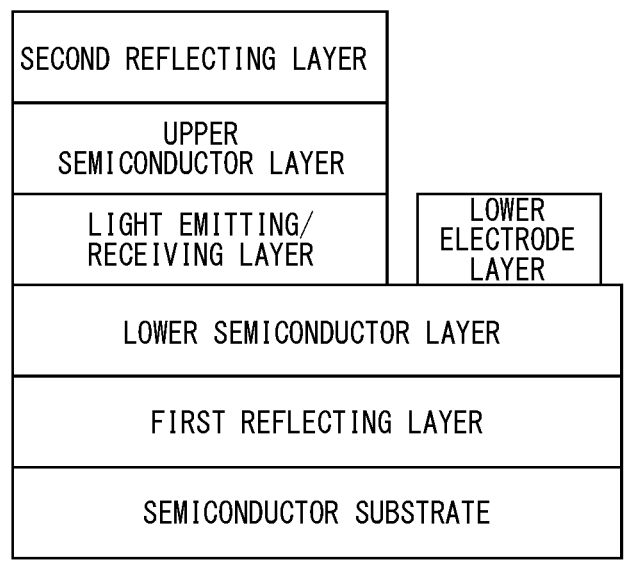
FIG. 6 is a configuration diagram of an infrared optical device according to an embodiment.

FIG. 6 is a configuration diagram for explaining an infrared optical device according to Embodiment 6 of the present disclosure. As illustrated in FIG. 6, the infrared optical device according to Embodiment 6 includes: a semiconductor substrate; a thin film laminate portion formed on the semiconductor substrate and including a first reflecting layer, a lower semiconductor layer, a light emitting/receiving layer, an upper semiconductor layer, and a second reflecting layer; and a lower electrode layer. As a result of the lower electrode layer contacting the lower semiconductor layer, an infrared optical device with little series resistance can be formed. The structure of the light emitting/ receiving layer in the infrared optical device according to this embodiment may be the same as that in Embodiment 3, 4, or 5.

Embodiment 7

Figure 7:
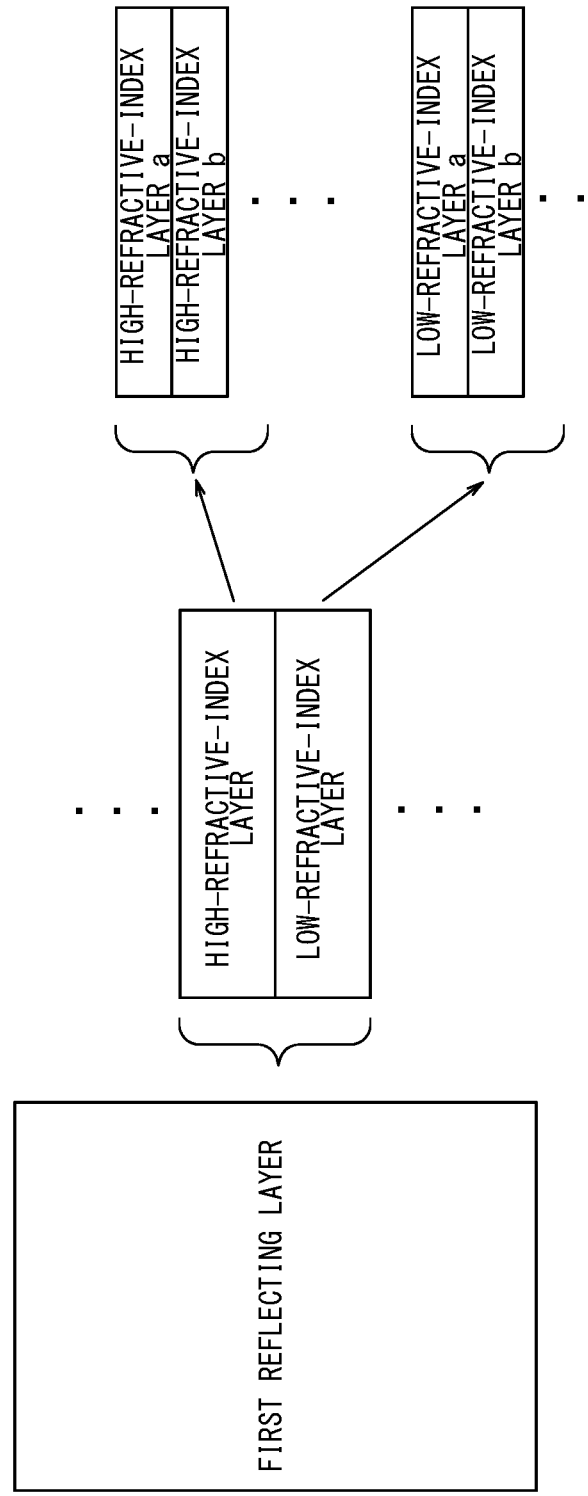
FIG. 7 is a configuration diagram of a first reflecting layer in an infrared optical device according to an embodiment.

FIG. 7 is a configuration diagram for explaining a first reflecting layer in an infrared optical device according to Embodiment 7 of the present disclosure. As illustrated in FIG. 7, in the infrared optical device according to Embodiment 7, the first reflecting layer is formed by laminating a low-refractive-index layer and a high-refractive-index layer. The low-refractive-index layer and the high-refractive-index layer may each be composed of a plurality of layers. For example, the high-refractive-index layer may be a laminate of a plurality of high-refractive-index layers a, b, etc. having different refractive indexes. The structure of the layers other than the first reflecting layer in the infrared optical device according to this embodiment may be the same as that in Embodiment 1, 2, or 6. The structure of the light emitting/receiving layer in the infrared optical device according to this embodiment may be the same as that in Embodiment 3, 4, or 5.

EXAMPLES

Example 1

The following example is an example of a light emitting element whose center wavelength λ is approximately 9.5 μm. Table 1 shows respective thin-film structures of Comparative Example 1 and Example 1. In Example 1, a first reflecting layer is a laminate of a three-layer structure composed of a low-refractive-index layer of each of layer numbers 5 to 6, a high-refractive-index layer of layer number 7, and a low-refractive-index layer of layer number 8. Layer number 4 is a light emitting layer. Layer numbers 2 to 3 are each an upper semiconductor layer. Layer number 1 is a second reflecting layer. The n-InSb layer and the n-AlInSb layer (layer numbers 5 to 6) uppermost in the first reflecting layer also function as a lower semiconductor layer.

Each infrared light emitting element was produced by the following procedure: First, thin-film layers other than the Au/Pt/Ti layer (second reflecting layer) shown in (Example 1) in Table 1 were formed on a semi-insulating GaAs substrate by MBE. A mesa structure was formed by performing etching up to the upper n-InSb layer by dry etching, and a protective layer made of $SiO_2$ and SiN was formed. After this, a window was opened for an electrode-semiconductor contact portion. An electrode layer composed of an Au/Pt/Ti layer was then formed so as to cover the window opening. The electrode layer above the p-InSb layer functions as an upper electrode layer and a second reflecting layer. The electrode layer above the n-InSb layer functions as a lower electrode layer. Infrared light was emitted from the GaAs substrate side. As shown in Table 1, the infrared light emitting element of Comparative Example 1 includes only low-refractive-index layers of layer numbers 5 to 7, and does not include a first reflecting layer composed of a plurality of layers having different impurity concentrations as in Example 1.

Figure 8:
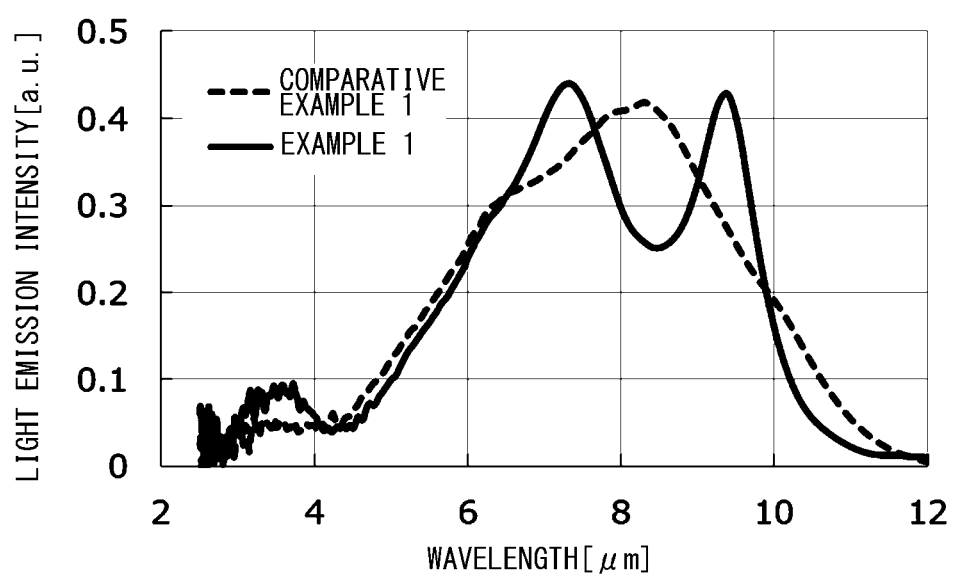
FIG. 8 is a diagram illustrating comparison between the light emission spectra of the infrared light emitting elements of Example 1 and Comparative Example 1.

FIG. 8 illustrates comparison in light emission intensity between the respective infrared light emitting elements of Example 1 and Comparative Example 1. The light emitting element of Example 1 exhibited a light emission intensity spectrum having a peak at approximately 9.5 μm. The light emission intensity at a wavelength of 9.5 μm in Example 1 was an improvement of approximately 1.5 times over Comparative Example 1.

TABLE 1

| Layer number | Film structure (impurity concentration) | Film thickness |
|---|---|---|
| (Comparative Example 1) | | |
| 1 | Au/Pt/Ti | 300 nm/20 nm/20 nm |
| 2 | p-InSb (Zn: $1.7 \times 10^{18}/cm^3$) | 500 nm |
| 3 | p-$Al_{0.18}In_{0.82}Sb$ (Zn: $1.7 \times 10^{18}/cm^3$) | 20 nm |
| 4 | π-$InAs_{0.13}Sb_{0.87}$ (Zn: $1.0 \times 10^{17}/cm^3$) | 2400 nm |
| 5 | n-$Al_{0.18}In_{0.82}Sb$ (Sn: $7.0 \times 10^{18}/cm^3$) | 20 nm |
| 6 | n-AlInSb (Sn: $7.0 \times 10^{18}/cm^3$) | 1000 nm |
| 7 | n-InSb (Sn: $7.0 \times 10^{18}/cm^3$) | 500 nm |
| 8 | Semi-insulating GaAs | — |
| (Example 1) | | |
| 1 | Au/Pt/Ti | 300 nm/20 nm/20 nm |
| 2 | p-InSb (Zn: $1.7 \times 10^{18}/cm^3$) | 200 nm |
| 3 | p-$Al_{0.18}In_{0.82}Sb$ (Zn: $1.7 \times 10^{18}/cm^3$) | 20 nm |
| 4 | π-$InAs_{0.13}Sb_{0.87}$ (Zn: $1.0 \times 10^{17}/cm^3$) | 2800 nm |
| 5 | n-$Al_{0.18}In_{0.82}Sb$ (Sn: $7.0 \times 10^{18}/cm^3$) | 20 nm |
| 6 | n-InSb (Sn: $7.0 \times 10^{18}/cm^3$) | 640 nm |
| 7 | i-InSb (undoped) | 700 nm |
| 8 | n-InSb (Sn: $7.0 \times 10^{18}/cm^3$) | 740 nm |
| 9 | Semi-insulating GaAs | — |

Example 2

Figure 9:
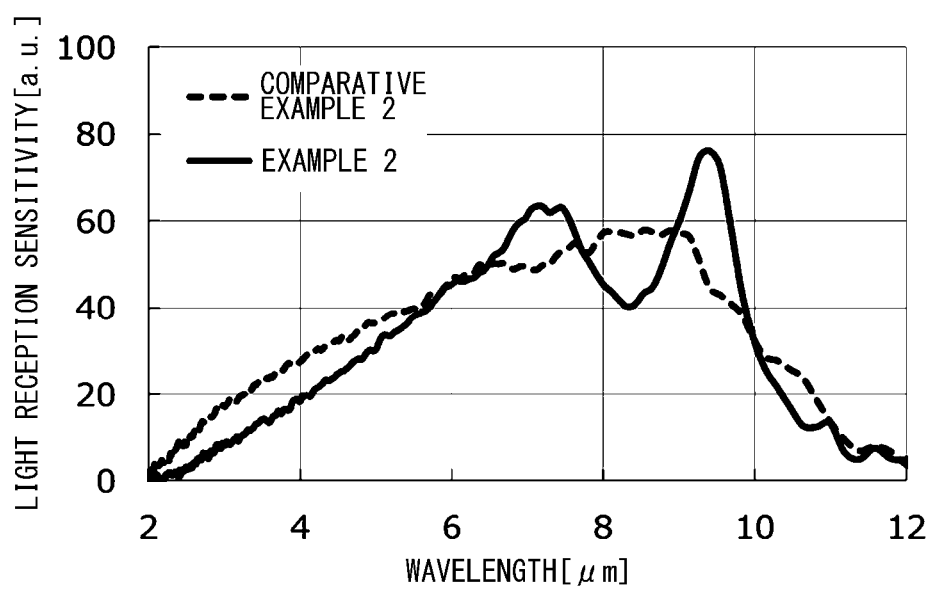
FIG. 9 is a diagram illustrating comparison between the light reception spectra of the infrared light receiving elements of Example 2 and Comparative Example 2.

The following example is an example of a light receiving element whose center wavelength λ is approximately 9.5 μm. The thin-film structure and the device production method are the same as those in the foregoing Example 1 and Comparative Example 1. FIG. 9 illustrates comparison in light reception sensitivity between the respective infrared light receiving elements of Example 2 and Comparative Example 2. Infrared light was incident from the GaAs substrate side. The light receiving element of Example 2 exhibited a light reception sensitivity spectrum having a peak at approximately 9.5 μm. The light reception sensitivity at a wavelength of 9.5 μm in Example 2 was an improvement of approximately 1.7 times over Comparative Example 2. The light receiving element of Example 2 exhibited a significant improvement in sensitivity as compared with the prediction of 1.17 times (=2.8 μm/2.4 μm) assumed from the active layer film thickness ratio.

Example 3

Figure 10:
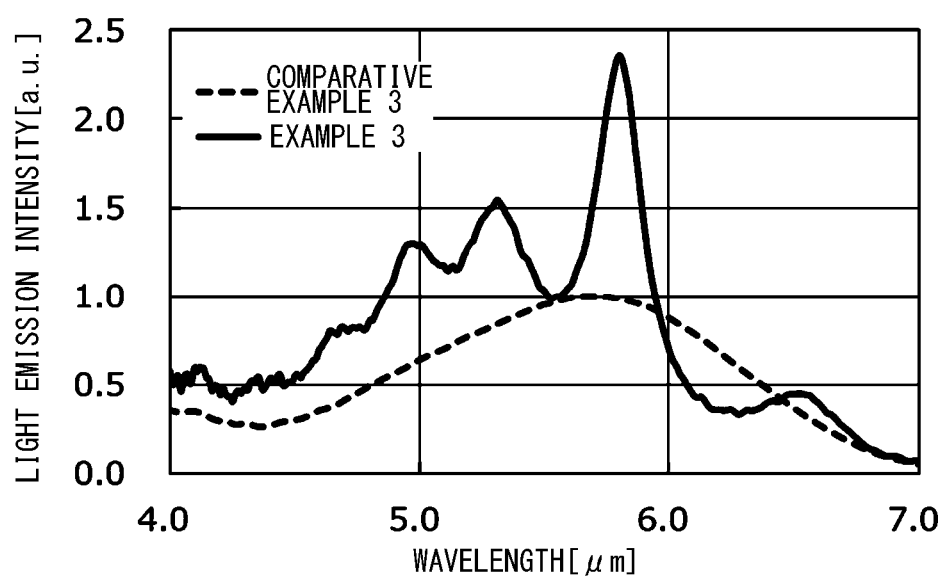
FIG. 10 is a diagram illustrating comparison between the light emission spectra of the infrared light emitting elements of Example 3 and Comparative Example 3.

The following example is an example of a light emitting element whose center wavelength λ is approximately 5.8 μm. Table 2 shows respective thin-film structures of Comparative Example 3 and Example 3. In Example 3, layer number 9 is a first reflecting layer. Layer numbers 7 to 8 are each a lower semiconductor layer. Layer numbers 4 to 6 are each a light emitting layer. Layer numbers 2 to 3 are each an upper semiconductor layer. The first reflecting layer is a laminate of seven pairs of high-refractive-index layers and low-refractive-index layers, i.e. a laminate of 14 layers in total. The light emitting layer has a double heterostructure of i-AlInSb/i-InSb/i-AlInSb, and radiative recombination occurs in the InSb layer with a small bandgap. FIG. 10 illustrates comparison in light emission intensity between the respective infrared light emitting elements of Example 3 and Comparative Example 3. The light emitting element of Example 3 exhibited a light emission intensity spectrum having a peak at approximately 5.8 µm. As shown in Table 2, the infrared light emitting element of Comparative Example 3 does not include the first reflecting layer. The light emission intensity at a wavelength of 5.8 µm in Example 3 was an improvement of approximately 2.3 times over Comparative Example 3.

TABLE 2

| Layer number | Film structure (impurity concentration) | Film thickness |
|---|---|---|
| (Comparative Example 3) | | |
| 1 | Au/Pt/Ti | 300 nm/20 nm/20 nm |
| 2 | p-$Al_{0.06}In_{0.94}Sb$ (Zn: $1.7 \times 10^{18}/cm^3$) | 500 nm |
| 3 | p-$Al_{0.25}In_{0.75}Sb$ (Zn: $1.7 \times 10^{18}/cm^3$) | 20 nm |
| 4 | i-$Al_{0.06}Sn_{0.94}Sb$ (undoped) | 190 nm |
| 5 | i-InSb (undoped) | 370 nm |
| 6 | i-$Al_{0.06}Sn_{0.94}Sb$ (undoped) | 570 nm |
| 7 | n-$Al_{0.25}In_{0.75}Sb$ (Sn: $7.0 \times 10^{18}/cm^3$) | 20 nm |
| 8 | n-$Al_{0.06}In_{0.94}Sb$ (Sn: $7.0 \times 10^{18}/cm^3$) | 1500 nm |
| 9 | n-InSb (Sn: $7.0 \times 10^{18}/cm^3$) | 500 nm |
| 10 | Semi-insulating GaAs | — |
| (Example 3) | | |
| 1 | Au/Pt/Ti | 300 nm/20 nm/20 nm |
| 2 | p-$Al_{0.06}In_{0.94}Sb$ (Zn: $1.7 \times 10^{18}/cm^3$) | 680 nm |
| 3 | p-$Al_{0.25}In_{0.75}Sb$ (Zn: $1.7 \times 10^{18}/cm^3$) | 20 nm |
| 4 | i-$Al_{0.06}Sn_{0.94}Sb$ (undoped) | 190 nm |
| 5 | i-InSb (undoped) | 370 nm |
| 6 | i-$Al_{0.06}Sn_{0.94}Sb$ (undoped) | 570 nm |
| 7 | n-$Al_{0.25}In_{0.75}Sb$ (Sn: $7.0 \times 10^{18}/cm^3$) | 20 nm |
| 8 | n-$Al_{0.08}In_{0.92}Sb$ (Sn: $7.0 \times 10^{18}/cm^3$) | 868 nm |
| 9 | n-$Al_{0.06}Sn_{0.94}Sb$/i-$Al_{0.06}Sn_{0.94}Sb$ (Sn: $7.0 \times 10^{18}/cm^3$/undoped) | 444 nm/386 nm × 7 pairs |
| 10 | n-InSb (Sn: $7.0 \times 10^{18}/cm^3$) | 500 nm |
| 11 | Semi-insulating GaAs | — |

Example 4

Figure 11:
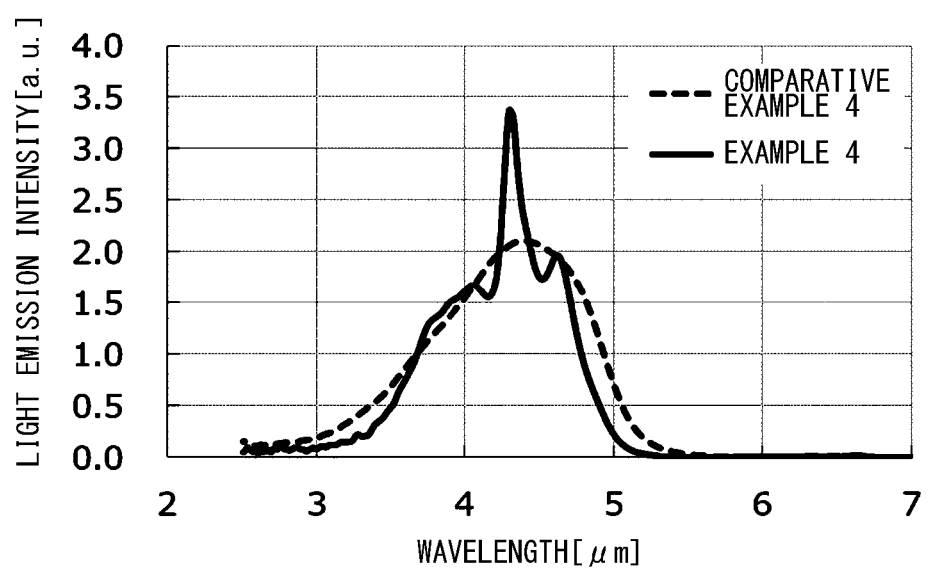
FIG. 11 is a diagram illustrating comparison between the light emission spectra of the infrared light emitting elements of Example 4 and Comparative Example 4.

The following example is an example of a light emitting element whose center wavelength λ is approximately 4.3 µm. Table 3 shows respective thin-film structures of Comparative Example 4 and Example 4. In Example 4, layer number 9 is a first reflecting layer. Layer numbers 7 to 8 are each a lower semiconductor layer. Layer numbers 4 to 6 are each a light emitting layer. Layer numbers 2 to 3 are each an upper semiconductor layer. The first reflecting layer is a laminate of 12 pairs of high-refractive-index layers and low-refractive-index layers, i.e. a laminate of 24 layers in total. The light emitting layer is a multiple quantum well layer made of i-AlInSb/i-InSb/i-AlInSb. FIG. 11 illustrates comparison in light emission intensity between the respective infrared light emitting elements of Example 4 and Comparative Example 4. The light emitting element of Example 4 exhibited a light emission intensity spectrum having a peak at approximately 4.3 µm. As shown in Table 3, the infrared light emitting element of Comparative Example 4 includes graded composition layers, and does not include the first reflecting layer composed of a plurality of layers having different impurity concentrations as in Example 4. The light emission intensity at a wavelength of 4.3 µm in Example 4 was an improvement of approximately 1.6 times over Comparative Example 4.

TABLE 3

| Layer number | Film structure (impurity concentration) | Film thickness |
|---|---|---|
| (Comparative Example 4) | | |
| 1 | Au/Pt/Ti | 300 nm/20 nm/20 nm |
| 2 | p-$Al_{0.14}In_{0.86}Sb$ (Zn: $1.7 \times 10^{18}/cm^3$) | 500 nm |
| 3 | p-$Al_{0.32}In_{0.68}Sb$ (Zn: $1.7 \times 10^{18}/cm^3$) | 20 nm |
| 4 | i-$Al_{0.14}Sn_{0.86}Sb$ (undoped) | 150 nm |
| 5 | i-$Al_{0.14}Sn_{0.86}Sb$/i-InSb (undoped) | 20 nm/10 nm × 9 pairs |
| 6 | i-$Al_{0.14}Sn_{0.86}Sb$ (undoped) | 440 nm |
| 7 | n-$Al_{0.32}In_{0.68}Sb$ (Sn: $7.0 \times 10^{18}/cm^3$) | 20 nm |
| 8 | n-$Al_{0.14}In_{0.86}Sb$ (Sn: $7.0 \times 10^{18}/cm^3$) | 1800 nm |
| 9 | n-$Al_{0.05}In_{0.95}Sb \rightarrow$ n-$Al_{0.14}In_{0.86}Sb$ [graded composition] (Sn: $7.0 \times 10^{18}/cm^3$) | 440 nm |
| 10 | n-InSb (Sn: $7.0 \times 10^{18}/cm^3$) | 500 nm |
| 11 | Semi-insulating GaAs | — |
| (Example 4) | | |
| 1 | Au/Pt/Ti | 300 nm/20 nm/20 nm |
| 2 | p-$Al_{0.14}In_{0.86}Sb$ (Zn: $1.7 \times 10^{18}/cm^3$) | 520 nm |
| 3 | p-$Al_{0.32}In_{0.68}Sb$ (Zn: $1.7 \times 10^{18}/cm^3$) | 20 nm |
| 4 | i-$Al_{0.14}Sn_{0.86}Sb$ (undoped) | 135 nm |
| 5 | i-$Al_{0.14}Sn_{0.86}Sb$/i-InSb (undoped) | 20 nm/10 nm × 9 pairs |
| 6 | i-$Al_{0.14}Sn_{0.86}Sb$ (undoped) | 425 nm |
| 7 | n-$Al_{0.32}In_{0.68}Sb$ (Sn: $7.0 \times 10^{18}/cm^3$) | 20 nm |
| 8 | n-$Al_{0.08}In_{0.92}Sb$ (Sn: $7.0 \times 10^{18}/cm^3$) | 600 nm |
| 9 | n-$Al_{0.08}Sn_{0.92}Sb$/i-$Al_{0.08}Sn_{0.92}Sb$ (Sn: $7.0 \times 10^{18}/cm^3$/undoped) | 310 nm/275 nm × 12 pairs |
| 10 | n-InSb (Sn: $7.0 \times 10^{18}/cm^3$) | 600 nm |
| 11 | Semi-insulating GaAs | — |

Example 5

Figure 12:
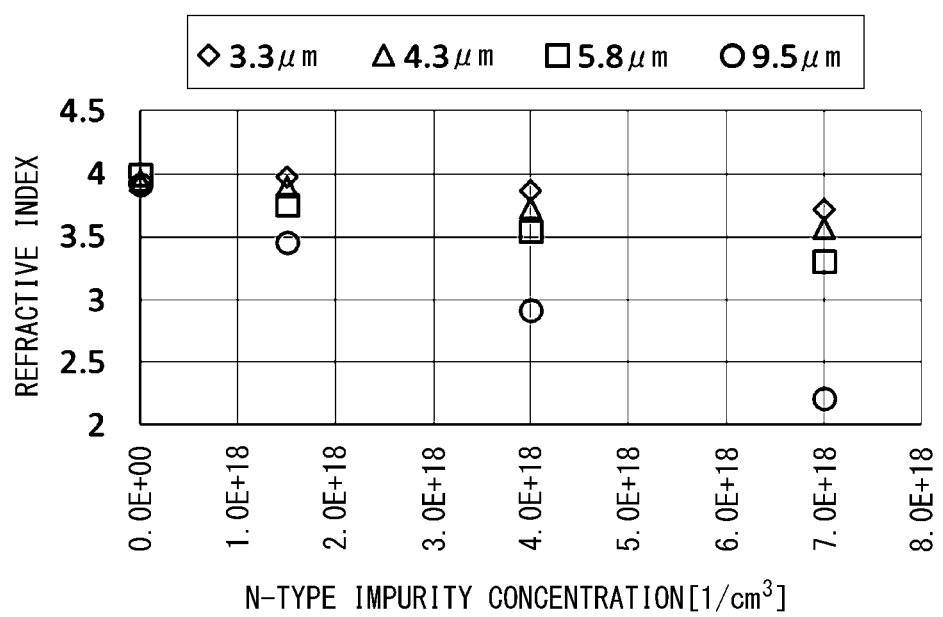
FIG. 12 is a diagram illustrating the dependence of the refractive index of an InSb layer on the n-type impurity concentration.

The following example is an example of a first reflecting layer in an infrared optical device. FIG. 12 illustrates the dependence of the refractive index of an InSb layer on the n-type impurity concentration. Doping was performed using Sn. As is clear from the drawing, the refractive index decreased greatly with an increase in n-type impurity concentration, i.e. n-type carrier concentration. This tendency increased from short wavelengths to long wavelengths. Meanwhile, there was no noticeable dependence of the refractive index on the p-type impurity concentration as compared with the n-type impurity concentration. The same tendency was seen for a material obtained by mixing InSb with Al, Ga, and As. The leftmost point in FIG. 12 where the n-type impurity concentration is 0 indicates the value of undoped i-InSb.

Figure 14:
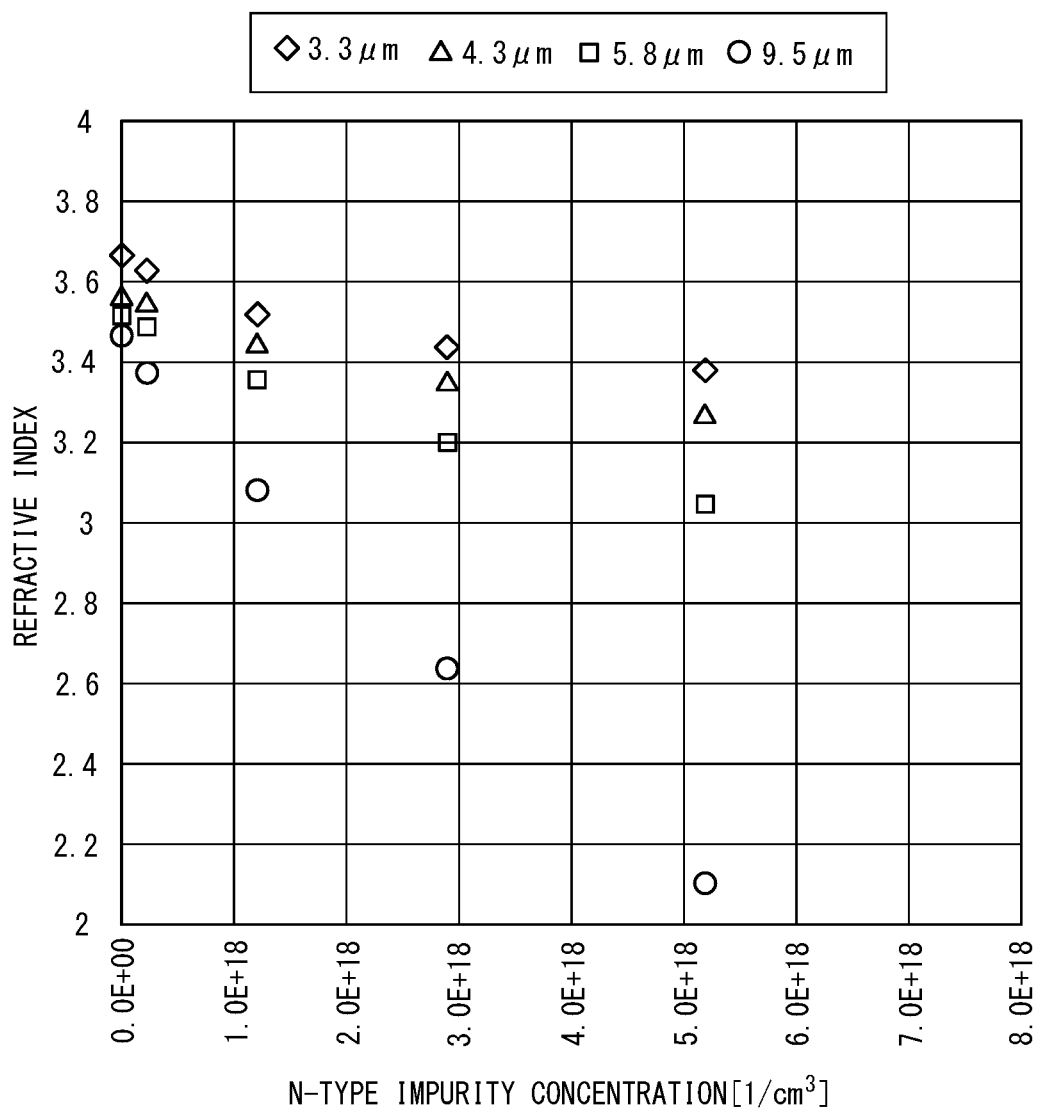
FIG. 14 is a diagram illustrating the dependence of the refractive index of an InAs layer on the n-type impurity concentration.

Likewise, FIG. 14 illustrates the dependence of the refractive index of an InAs layer on the n-type impurity concentration. Doping was performed using Sn. As is clear from the drawing, the refractive index decreased greatly with an increase in n-type impurity concentration, i.e. n-type carrier concentration. This tendency increased from short wavelengths to long wavelengths. Meanwhile, there was no noticeable dependence of the refractive index on the p-type impurity concentration as compared with the n-type impurity concentration. The same tendency was seen for a material obtained by mixing InAs with Al, Ga, and As. The leftmost point in FIG. 14 where the n-type impurity concentration is 0 indicates the value of undoped i-InAs.

Figure 13:
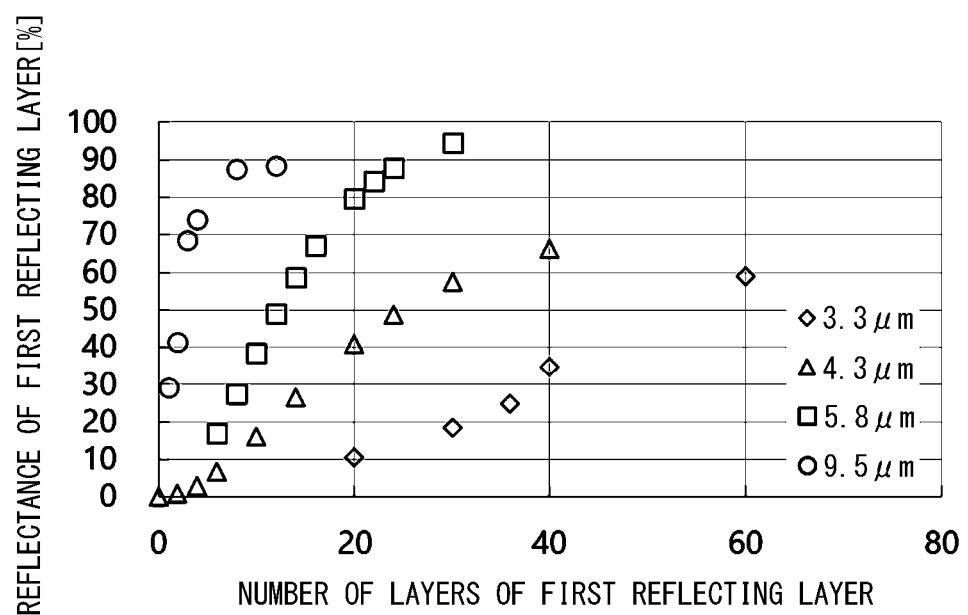
FIG. 13 is a diagram illustrating the results of trial calculation of the reflectance of a laminate obtained by laminating InSb layers different in impurity concentration with respect to the number of layers.

FIG. 13 illustrates the results of trial calculation of the reflectance of a laminate obtained by laminating InSb layers different in impurity concentration with respect to the number of layers, at several wavelengths. An undoped InSb layer was used as a high-refractive-index layer, and an InSb layer of $7.0\times10^{18}/cm^3$ was used as a low-refractive-index layer. As can be understood from the drawing, the reflectance was improved with an increase in the number of layers, at each wavelength. The same tendency was seen for AlInSb and InAsSb. In FIG. 12, FIG. 13, and FIG. 14, the results of calculation performed for infrared optical devices of 3.3 μm, 4.3 μm, 5.8 μm, and 9.5 μm in center wavelength λ are plotted. The carrier concentration is determined by the impurity concentration and the activation rate. For example, the activation rate of Sn which is an n-type impurity was approximately 1. For example, the activation rate of Zn which is a p-type impurity was approximately 2.

Although the embodiments of the present disclosure have been described above, the technical scope of the present disclosure is not limited to the scope disclosed herein. Various modifications or improvements can be added to the foregoing embodiments. It will be appreciated that the claims cover all such modifications or improvements as falling within the technical scope of the present disclosure.

The invention claimed is:

1. An infrared optical device that has a light emission/reception property of having a peak at a center wavelength λ, the infrared optical device comprising:
a semiconductor substrate; and
a thin film laminate portion including a first reflecting layer formed on the semiconductor substrate, a lower semiconductor layer of a first conductivity type, a light emitting/receiving layer, an upper semiconductor layer of a second conductivity type, and a second reflecting layer in the stated order,
wherein the first reflecting layer has a constituent material made of AlGaInAsSb where 0≤Al+Ga≤0.5 and 0≤As≤1.0, and includes a plurality of layers that differ in impurity concentration, and
the center wavelength λ is 2.5 μm or more at room temperature.

2. The infrared optical device according to claim 1, wherein the first reflecting layer includes: a low-refractive-index layer that is composed of an n-type semiconductor layer of $1.0\times10^{18}/cm^3$ or more; and a high-refractive-index layer that is composed of at least one out of a p-type semiconductor layer, an intrinsic semiconductor layer, and an n-type semiconductor layer lower in impurity concentration than the n-type semiconductor layer of the low-refractive-index layer and has a higher refractive index than the low-refractive-index layer, and
the first reflecting layer is a laminate of a plurality of layers obtained by alternately laminating the low-refractive-index layer and the high-refractive-index layer.

3. The infrared optical device according to claim 2, wherein the low-refractive-index layer includes an n-type semiconductor layer of $3.0\times10^{18}/cm^3$ or more.

4. The infrared optical device according to claim 2, wherein the high-refractive-index layer includes at least one out of the p-type semiconductor layer, the intrinsic semiconductor layer, and an n-type semiconductor layer of less than $8.0\times10^{17}/cm^3$.

5. The infrared optical device according to claim 1, wherein the thin film laminate portion further includes a third reflecting layer made of a material different from the first reflecting layer, between the semiconductor substrate and the first reflecting layer.

6. The infrared optical device according to claim 5, wherein the semiconductor substrate is a GaAs substrate, and a constituent material of the third reflecting layer is made of AlGaAs where 0≤Al≤1.0.

7. The infrared optical device according to claim 1, wherein a material of the light emitting/receiving layer contains AlGaInAsSb where 0≤Al+Ga≤0.5 and 0≤As≤1.0, and
the center wavelength λ is 3.0 μm or more at the room temperature.

8. The infrared optical device according to claim 1, wherein the first reflecting layer is a laminate of 2 layers or more and 30 layers or less, and
the center wavelength λ is 4.0 μm or more at the room temperature.

9. The infrared optical device according to claim 1, wherein the first reflecting layer is a laminate of 2 layers or more and 12 layers or less, and
the center wavelength λ is 6.0 μm or more at the room temperature.

10. The infrared optical device according to claim 1, wherein the first reflecting layer is a laminate of 2 layers or more and 6 layers or less, and
the center wavelength λ is 8.0 μm or more at the room temperature.

11. The infrared optical device according to claim 1, wherein the light emitting/receiving layer includes a double heterostructure or one or more quantum well structures.

12. The infrared optical device according to claim 1, wherein the light emitting/receiving layer includes a plurality of light emitting/receiving regions connected by a tunnel junction.

13. The infrared optical device according to claim 1, further comprising a lower electrode layer,
wherein the lower electrode layer contacts the lower semiconductor layer.

14. The infrared optical device according to claim 1 wherein the semiconductor substrate is semi-insulating, and
the thin film laminate portion comprises a plurality of thin film laminate portions formed on the semiconductor substrate and connected in series or in parallel.

15. The infrared optical device according to claim 1 wherein the second reflecting layer is composed of an electrode.

16. The infrared optical device according to claim 1, further comprising an upper electrode layer,
   wherein the upper electrode layer contacts the upper semiconductor layer.

17. The infrared optical device according to claim 1, wherein light enters or exits from a side on which the semiconductor substrate is located.

18. The infrared optical device according to claim 1, wherein the first reflecting layer has a constituent material made of AlGaInAsSb where $0 \leq Al+Ga \leq 0.5$ and $0 \leq As \leq 0.5$, and includes a plurality of layers that differ in impurity concentration.

* * * * *